United States Patent [19]

Sakurai et al.

[11] Patent Number: 4,642,883
[45] Date of Patent: Feb. 17, 1987

[54] SEMICONDUCTOR BIPOLAR INTEGRATED CIRCUIT DEVICE AND METHOD FOR FABRICATION THEREOF

[75] Inventors: Junji Sakurai, Tokyo; Hajime Kamioka, Yokohama, both of Japan

[73] Assignee: Fujitsu Limited, Kawasaki, Japan

[21] Appl. No.: 695,746

[22] Filed: Jan. 28, 1985

Related U.S. Application Data

[63] Continuation of Ser. No. 531,588, Sep. 13, 1983, abandoned, which is a continuation of Ser. No. 218,006, Dec. 18, 1980, abandoned.

[30] Foreign Application Priority Data

Dec. 21, 1979 [JP] Japan .................................. 54-166596

[51] Int. Cl.$^4$ .................. H01L 21/223; H01L 21/265
[52] U.S. Cl. ................... 29/576 B; 29/576 W; 148/1.5; 148/DIG. 10; 148/DIG. 23; 148/DIG. 87; 357/34; 357/92
[58] Field of Search .............. 29/571, 576 B, 576 W, 29/578; 148/1.5

[56] References Cited

U.S. PATENT DOCUMENTS

| | | | |
|---|---|---|---|
| 3,814,995 | 6/1974 | Teszner | 357/55 |
| 3,974,560 | 8/1976 | Mueller et al. | 357/55 |
| 4,056,413 | 11/1977 | Yoshimura | 357/34 X |
| 4,089,021 | 5/1978 | Sato et al. | 357/34 X |
| 4,199,776 | 4/1980 | Ahmed | 357/92 X |
| 4,219,369 | 8/1980 | Ogiue et al. | 357/34 X |
| 4,223,328 | 9/1980 | Terasawa et al. | 357/55 |
| 4,261,761 | 4/1981 | Sato et al. | 148/1.5 |
| 4,261,763 | 4/1981 | Kumar et al. | 357/91 |
| 4,277,882 | 7/1981 | Crossley | 29/571 |
| 4,298,402 | 11/1981 | Hingarh | 357/91 |
| 4,382,826 | 5/1983 | Pfleiderer et al. | 29/571 |
| 4,390,890 | 6/1983 | Bergeron et al. | 357/46 |
| 4,445,266 | 5/1984 | Mai et al. | 29/571 |
| 4,454,524 | 6/1984 | Spence | 29/576 B |
| 4,598,462 | 7/1986 | Chandrasekhar | 29/577 C |

FOREIGN PATENT DOCUMENTS

| | | | |
|---|---|---|---|
| 2845062 | 4/1979 | Fed. Rep. of Germany | 357/34 |
| 53-87672 | 8/1978 | Japan | 357/34 |
| 54-151377 | 11/1979 | Japan | 357/55 |
| 54-152981 | 12/1979 | Japan | 357/92 |

*Primary Examiner*—Olik Chaudhuri
*Attorney, Agent, or Firm*—Staas & Halsey

[57] ABSTRACT

Disclosed is a structure of a semiconductor integrated circuit device including circuit elements such as a bipolar transistor and I$^2$L. The structure comprises a buried layer formed by the ion implantation method using an insulating layer, having a window with tapered edges at the surface of semiconductor substrate, as a mask. A part of the buried layer appears at the surface of the semiconductor substrate, thus establishing the connection of electrodes. The circuit element is formed in the region bounded by the buried layer and the window.

3 Claims, 16 Drawing Figures

SEMICONDUCTOR BIPOLAR INTEGRATED CIRCUIT DEVICE AND METHOD FOR FABRICATION THEREOF

This is a continuation of co-pending application Ser. No. 531,588 filed on Sept. 13, 1983, which is a continuation of application Ser. No. 218,006, filed on Dec. 18, 1980, both now abandoned.

BACKGROUND OF THE INVENTION

1. Field of the Invention

The present invention relates to a semiconductor integrated circuit device and a method for fabrication thereof, particularly to a bipolar integrated circuit device and a method for production thereof.

2. Description of the Prior Art

Bipolar integrated circuit transistor devices generally have a structure as indicated in FIG. 1. In the same figure, 1 is the P type semiconductor substrate; 2 is the N type epitaxial layer formed on the substrate 1; 3 is the N+ type buried layer deposited at the boundary of the substrate 1 and epitaxial layer 2; 4 is the P type isolation region formed reaching the substrate 1 from the surface of the epitaxial layer 2. In addition, 5 is the P type base region formed on the epitaxial layer 2 in the element forming region defined by the isolation region 4; 6 is the N+ type emitter region formed within the base region 5; 7 is the N+ type collector contact region formed within the epitaxial layer. Moreover, 8 is the insulating film covering the surface of said epitaxial layer 2; 9 is the emitter electrode; 10 is the base electrode; 11 is the collector electrode.

In such a bipolar transistor, the collector consists of the N+ type buried layer 3 and the N+ type collector contact region 7. Therefore, a collector series resistance can be lowered and the high operating speed of the relevant bipolar transistor can be improved by forming the buried layer 3 and the collector contact region 7 in proximity to each other, and, when possible, in such a way as to come into contact.

However, according to such production method of the bipolar transistor, the collector contact region 7 is generally formed simultaneously with the emitter region 6 and resultingly it is formed almost in the same depth as the emitter region 6 and does not reach the buried layer 3. Thus the epitaxial layer 2 of lower impurity concentration exists between the collector contact region 7 and the buried layer 3, so that a lowering of the collector series resistance is not achieved. On the other hand, it is also attempted to form a deeper collector contact region 7 by separately forming the emitter region 6 and the collector contact region 7 but such fabrication method results in an increase in fabrication steps.

In order to overcome the difficulty in forming the collector in the conventional bipolar transistor and the fabrication method thereof, a method such as disclosed in the patent application Ser. No. 50-364 (application date: Dec. 23, 1974) has been proposed.

Namely, as indicated in FIG. 2, an insulating film 22 consisting of silicon dioxide is formed in the thickness of about 1 μm on the surface of a P type silicon semiconductor substrate 21.

Then, as illustrated in FIG. 3, the insulating film 22 is selectively removed by etching, thus forming a window 23 with a part of the semiconductor substrate 21 being exposed. At this time, the edge 23A of the window 23 of the insulating film 22 is tapered with an inclination of about 45 degree by properly selecting the etching conditions.

Next, phosphorus ions (P+) are implanted into the semiconductor substrate 21 using the insulating film 22 as the mask, thereby forming, as illustrated in FIG. 4, the N+ type buried layer 24 which is flat just under the window 23 and changes continuously in the depth corresponding to an inclination at the area just under the inclining portion of the insulating film 22 and partly extends up to the boundary of the semiconductor substrate 21 and the insulating film 22.

Then, the insulating film 22 is removed and as illustrated in FIG. 5 the insulating film 25 is newly formed on the surface of the semiconductor substrate 21.

Thereafter, a window is provided on the insulating film 25, and phosphorus ions (P+) are implanted into a P type region 26 surrounded by the N+ type layer 24 and the exposed area of the N+ type buried layer 24, thereby as illustrated in FIG. 6, an N+ type emitter region 27 and an N+ type collector contact region 28 are formed. In this case, the P type region 26 forms the base region. In the same figure, 29, 30 and 31 are respectively an emitter electrode, a base electrode and a collector electrode.

According to this proposed method, the N+ type buried layer 24 forms the collector region, and a part of the N+ type layer 24 can be formed up to the surface of semiconductor substrate using only a single ion implantation process. Therefore, this method is sufficient for forming the collector contact region 28 to the same depth as the emitter region 27, and thereby the production process is simplified over that associated with the structure illustrated in FIG. 1.

However, in such a proposed method, it is difficult to form the tapered portion to the desired inclination at the edge 23A of the window 23 on the insulating film 22 in the process illustrated in the FIG. 3. Namely, after providing the window 23 on the insulating film 22, the tapered portion is formed at the edge 23 of the window 23 by changing the etching solution or changing the mask for etching, thus the process is troublesome and it is difficult to form the window 23 having to the desired inclination angle and size.

SUMMARY OF THE INVENTION

It is an object of the present invention to provide a simple element structure which simplifies the forming of a buried layer in a bipolar integrated circuit device including an element having the buried layer.

It is a further object of the present invention to provide a simple element structure which improves the integration density of the bipolar integrated circuit device including an element having a buried layer.

Still another object of the present invention is to provide a fabrication method which simplifies the forming of a buried layer to the surface of a semiconductor substrate in circuit devices having a buried layer.

Still another object of the present invention is to provide a fabrication method which can improve the integration density of bipolar integrated circuit devices having a buried layer.

For these purposes, the present invention provides a semiconductor integrated circuit device comprising;

a semiconductor substrate, an insulating layer formed on the surface of said semiconductor substrate and having a window for defining an active region with the edge thereof inclined, a buried layer which is flat at the center of the active region of said semiconductor substrate defined by said insulating layer and is extending up to the surface of said semiconductor substrate with a certain curvature at the area near the window of said insulating layer, and a circuit element structured in said active region and surrounded by said buried layer being considered as the one conductive region, and a method for producing a semiconductor integrated circuit device comprising the steps of;

forming the insulating layer having a window with the edge tapered by selectively oxidizing the surface of a semiconductor substrate, defining an active region by said window provided on said insulating layer, ion implantating impurities into said semiconductor substrate using said insulating layer as a mask, forming an ion inplanted layer in the area not masked by said insulating layer, extending up to the surface of said semiconductor substrate corresponding to said tapering at the edge portion of said insulating layer and moreover extending continuously into said insulating layer from the surface of said semiconductor substrate, exposing at least a part of said ion inplanted layer to the surface of said semiconductor substrate by removing the surface portion of said insulating layer, and forming a circuit element where said ion inplanted layer in considered as the buried layer in the region of said semiconductor substrate surrounded by said ion inplanted layer.

DETAILED DESCRIPTION OF THE INVENTION

FIG. 7 to FIG. 13 respectively show the process of the present invention for fabricating a bipolar transistor included in a bipolar integrated circuit device.

According to the present invention, a P type silicon (Si) substrate 101 with an impurity concentration of about $1 \times 10^{15}$ atoms/cm$^3$ is utilized.

Figure 7:
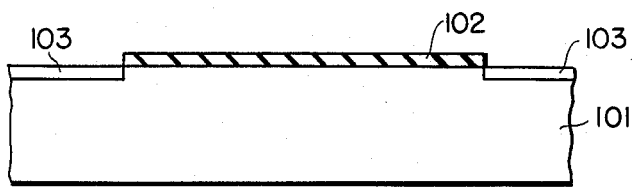
FIG. 7 to FIG. 13 are cross-sectional views of the first embodiment of the fabrication process for a bipolar integrated circuit device of the present invention.

Next, a silicon nitride film 102 is selectively formed on the active region of the surface of the silicon substrate 101 and a channel cut layer 103 with a concentration as high as $1 \times 10^{17}$ atoms/cm$^3$ is formed at the surface of silicon substrate 101 by ion implantation of boron ions (B+) into the surface of silicon substrate 101 using the silicon nitride film 102 as a mask. Such process is shown in FIG. 7.

Figure 8:
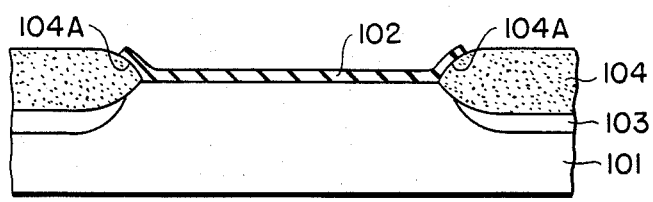

Thereafter the surface of the silicon substrate 101 is oxidized by the selective oxidation process using silicon nitride film 102 as a mask and thereby the silicon dioxide film (SiO$_2$) layer 104 is formed to a thickness of about 1.1 μm. Such a process is shown in FIG. 8.

According to such a selective oxidation process using the silicon nitride film 102 as the mask, the silicon dioxide layer 104 is formed in such a manner that a part of it progresses into the bottom of the silicon nitride film 102 along the boundary of the silicon nitride film 102 and the silicon substrate 101, causing so-called "bird's-beak". Therefore, when the silicon nitride film 102 is removed, the exposed portion of the silicon substrate 101, namely the active region, is defined by being surrounded with the silicon dioxide layer 104 of which edge 104A is inclined.

Figure 9:
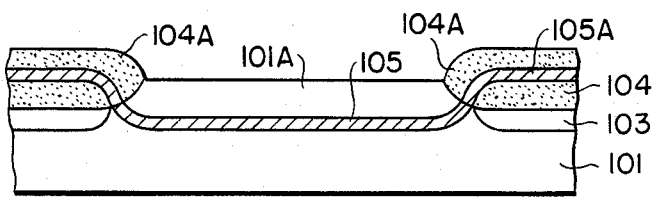

Thereafter, phosphorus ions (P+) are implanted into the silicon substrate 101 using the silicon dioxide layer 104 as the mask. For example, a ion implantation conditions are as follows; acceleration energy is 400 KeV and the dose is $1 \times 10^{15}$ atoms/cm$^2$. As a result, as illustrated in FIG. 9, the N+ type buried layer 105 of $2 \times 10^{19}$ atoms/cm$^3$ is formed at the depth of 5000 to 6000 Å within the silicon substrate 101 which is not covered with the silicon dioxide layer 104, the ion implantation layer 105A is formed to the depth of 4000 to 4500 Å within the silicon dioxide layer 104, and said N+ type buried layer 105 and the ion implantation layer 105A come into contact with each other at the surface of silicon substrate 101 under the tapered edge 104A of the silicon dioxide layer 104. Namely, the N+ type buried layer 105 gradually approaches the surface of the silicon substrate 101 along an angle under the tapered edge 104A of the silicon dioxide layer 104 and appears at the surface of the silicon substrate 101 under said silicon dioxide layer 104.

An active region 101A of the silicon substrate 101 surrounded by the N+ type buried layer 105 is inverted to the N− type region with the surface impurity concentration of about $1 \times 10^{17}$ atoms/cm$^3$ by the phosphorus ion implantation. This inversion occurs because the phosphorus ions are normally distributed (Gaussian distribution) in the ion implanted region. It is required to further increase the impurity concentration of such N− type active region 101A, it can be increased by a second implantation of phosphorus ions into the active region 101A using a reduced implantation energy.

Figure 10:
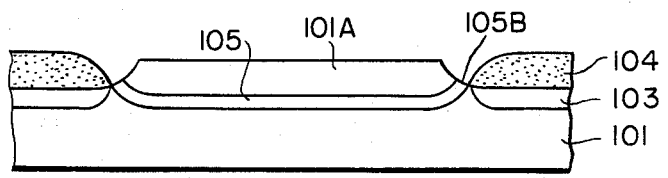

Thereafter, the surface of the silicon dioxide layer 104 is removed by etching with a fluoric acid series etching solution. Because phosphorus ion implantation is utilized, the portion of the silicon dioxide layer from the surface of the damaged silicon dioxide layer to the depth of 4000 to 4500 Å, including the layer 105A, is easily etched. In addition, by such etching process, the edge 105B of the N+ type buried layer 105 is exposed. Such process is shown in FIG. 10. In the etching process of the silicon dioxide layer 104, the etching speed for the portion into which the ion implantation has occurred is increased to about twice of that for the area into which the ion implantation has not occurred. Therefore, termination of etching for the portion into which the ion implantation has occurred can be easily detected by observing the change in etching speeds.

Figure 11:
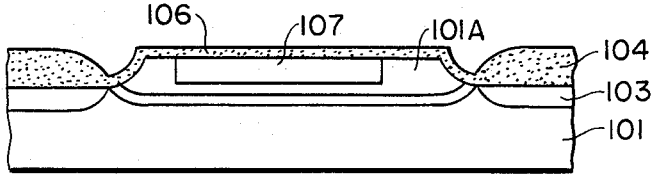

Thereafter, the silicon dioxide film 106 is formed to a thickness of about 2000 Å by the thermal oxidation process on the surface of said active region 101A. Then a window is selectively provided on the silicon dioxide film 106 and/or boron ions are implanted using the photoresist layer (not illustrated) formed on the silicon dioxide film 106 as the mask, thereby the P type base region 107 is formed on the active region 101A. For example, such boron ion implantation is carried out under the conditions that the acceleration energy is 50 KeV and the dose is $1 \times 10^{15}$ atoms/cm$^2$. As a result, the base region 107 is formed to a thickness of about 1500 Å. Such a process is shown in FIG. 11.

A window is provided on the silicon dioxide film 106 covering the base region 107 and the exposed portion 105B of the N+ buried layer 105 and the phosphosilicate glass (PSG) layer 108 is then formed to a thickness of about 6000 Å to 1 μm covering the window over the silicon dioxide layer 104 and silicon dioxide film 106. The well known CVD (chemical vapor deposition) method can be used for formation of such a PSG layer 108.

Figure 12:
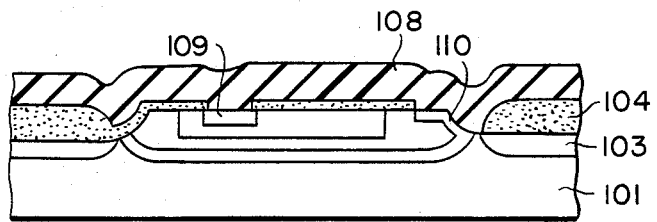

Then, the phosphorus is diffused from the PSG layer 108 by the heat treatment, thereby forming the N+ type emitter region 109 and N+ type collector contact region 110, each having a surface concentration of $1 \times 10^{20}$ atoms/cm$^3$ and a depth of about 2000 Å. The base region 107 reaches the depth of 3000 Å because the diffusion of boron ions advances during the heat treatment. Such a process is shown in FIG. 12.

Figure 13:
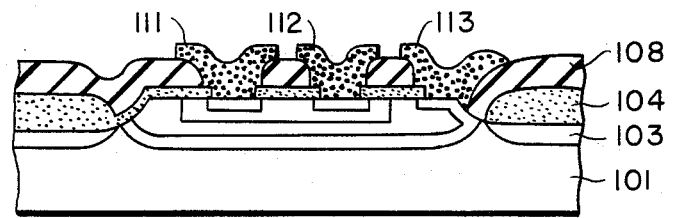

Next, windows are formed selectively on the PSG layer 108 and silicon dioxide film 106. Next a highly doped base contact region is formed, and then, moreover the aluminum layer is deposited to a thickness of about 1 μm by the evaporation method covering the windows and PSG layer 108. In succession, the aluminum layer is selectively removed by etching and the emitter electrode 111, base electrode 112, collector electrode 113 are formed. Such a process is shown in FIG. 13 where a grooved portion 115 of collector electrode 113 contacts the gently sloping portion of the buried layer 105.

According to such a bipolar transistor structure indicated in the embodiment of the present invention, the N+ type buried layer 105 which forms a portion of the collector curves up to the surface of the semiconductor substrate. Thereby connection with the collector contact region 110 can be easily made. As a result, the collector region series resistance can be made very small because, as shown in FIG. 13, the grooved portion 115 of collector electrode 113 contacts the buried layer 105.

Therefore, high speed operation of the relevant bipolar transistor can be realized.

In addition, since formation of the collector contact region 110 does not require a wider diffusion area extending from the buried layer to the surface of the substrate, the bipolar transistor can be made small in size, thus realizing higher integration density in an integrated circuit device.

According to such an embodiment of the present invention, since the silicon dioxide layer formed by the selective oxidation process is used as the mask for obtaining the buried layer, the edge of the window of the mask is naturally tapered. Therefore, as in the case of the prior art indicated in FIG. 2 to FIG. 6, the fabrication process of the present invention is greatly simplified compared with the method where the edge is tapered through a plurality of processings of the window of the mask used for forming the buried layer.

Moreover, according to the embodiment of the present invention, since the emitter region and collector contact region are formed in the same process, the fabrication steps can be simplified.

Figure 1:
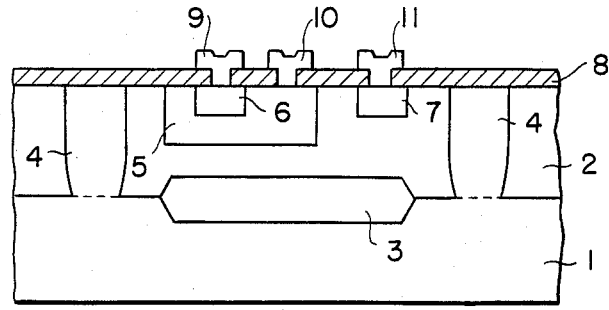
FIG. 1 is a cross-sectional view of a conventional bipolar transistor included in a bipolar integrated circuit device.
Figure 2:
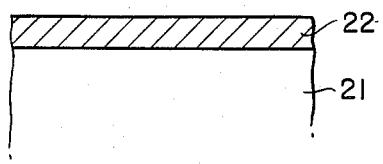
FIG. 2 to FIG. 6 are cross-sectional views for illustrating the method for producing a bipolar transistor as previously proposed by the assignee of the present invention.
Figure 3:
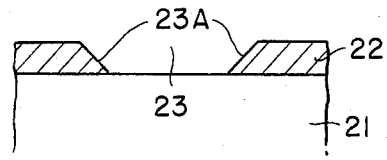
Figure 4:
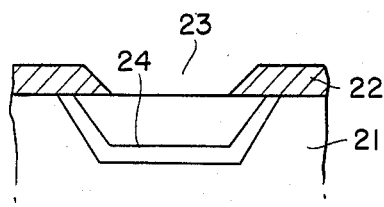
Figure 5:
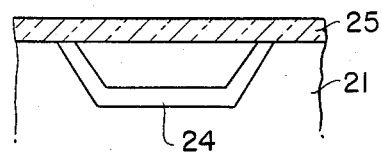
Figure 6:
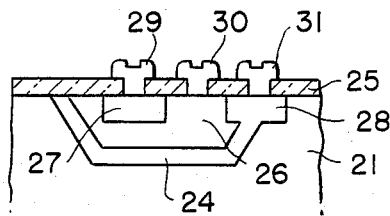

Furthermore, according to the embodiment of the present invention, the buried layer is formed by the ion implantation method and circuit elements such as transistors are formed in the semiconductor substrate surrounded by the buried layer, the epitaxial layer forming process which is required in the prior art shown in FIG. 1 is no longer necessary and thereby the fabrication process is simplified accordingly.

Figure 14:
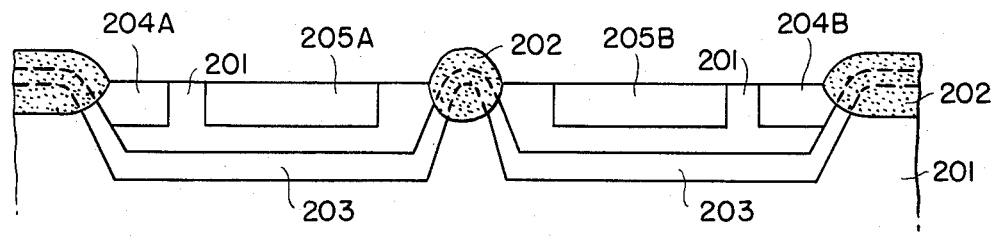
FIGS. 14 and 15 are cross-sectional views of the second embodiment of the fabrication process for a bipolar integrated circuit device of the present invention.
Figure 15:
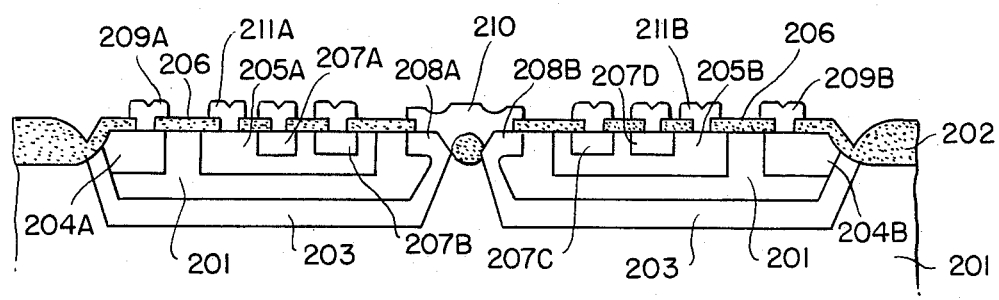
Figure 16:
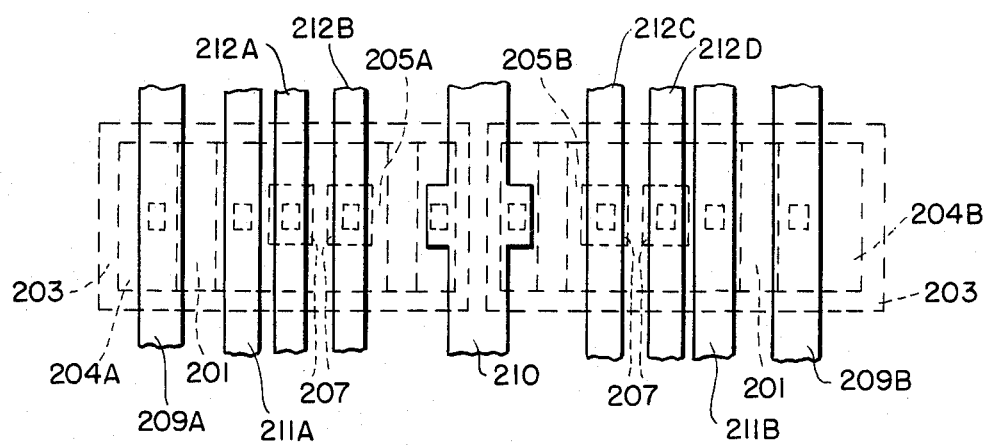
FIG. 16 is a plan view of the second embodiment of the fabrication process for a bipolar integrated circuit device of the present invention.

FIG. 14 to FIG. 16 respectively show the fabrication processes of an Integrated Injection Logic (IIL) device which is another embodiment of a bipolar integrated circuit device of the present invention. The IIL device is formed by using a technique similar to the above-described process.

FIG. 14 shows that the silicon dioxide layer 202 has a tapered edge and is grown on the surface of the N type silicon substrate 201 by the selective oxidation method and then the N+ type buried layer 202 is formed by phosphorus ion implantation using the silicon dioxide layer 202 as the mask.

Thereafter, the P type regions 204A, 204B, 205A, 205B are formed by the selective diffusion of boron or boron ion implantation into the active region surrounded by the N+ type buried layer 203. Here, since the silicon dioxide layer 202 which is used as the mask for ion implantation is formed with the edge tapered, the N+ type buried layer 203 is exposed to the surface of the silicon substrate 201 along said tapered edge.

The foregoing ion implantation for obtaining the buried layer 203 is performed under the condition, for example, that the acceleration energy is 400 KeV and the dose is $1 \times 10^{15}$ atoms/cm$^2$. The ion implantation for obtaining said P type regions 204 and 205 is performed under the condition, for example, that the acceleration energy is 50 KeV and the dose is $1 \times 10^{14}$ atoms/cm$^2$.

FIG. 15 shows the stage of the process after exposing a part of the N+ type buried layer 203 by removing the portion of the silicon dioxide layer 202 damaged by ion implantation by the etching, the silicon dioxide film 206 is formed on the surface of the active region; the N type regions 207A, 207B, 207C and 207D and 208A, 208B are formed by providing windows in the silicon dioxide film 206 and implanting arsenic ions (As+) into said P type regions 205A and 205B and N type region 201; and then each electrode is formed by providing windows in the silicon dioxide film 206 and then depositing the metal layer such as aluminium and removing selectively the metal layer.

The arsenic ion implantation is carried out under the condition that, for example, the acceleration energy is 80 KeV and the dose is $5 \times 10^{15}$ atoms/cm$^2$.

FIG. 16 shows the plan view of the IIL device indicated in FIG. 15.

In the structure shown in FIG. 15 AND FIG. 16, the P type region 204, N type region 201 and P type region 205 form a lateral PNP transistor within the region surrounded by the N+ type buried layer 203 with the P type region 204 used as the injector and the N type region 201 as the base region.

In addition, the N type region 201, P type regions 205A and 205B and N type regions 207A, 207B, 207C and 207D form vertical NPN transistors respectively where the N+ type buried layer 203 used as the emitter leading portion, P type regions 205A and 205B as the base regions and the N type regions 207A, 207B, 207C and 207D as the collector regions respectively.

The electrodes 209A, 209B are respectively the injector electrodes and the electrode 210 is used as the base electrode of lateral PNP transitor and the emitter of vertical NPN transistor. Moreover, the electrodes 211A and 211B are respectively used as the collector electrode of lateral PNP transistor and the base electrode of vertical NPN transistor. Thus, the electrodes 212A to 212D form the collector electrode of the vertical NPN transistor.

According to such structure of the present invention, since the N+ type buried layer 203 extends up to the surface of semiconductor substrate, connection between the emitter region and the emitter contact region 208 of the vertical NPN transistor can be made very easily and thereby the emitter region series resistance can be kept very small.

Since the emitter region electrode is deposited at the surface of the silicon substrate 201, connection with the lead wire for leading electrode can be done easily.

Furthermore, since the P type injector region 204 is surrounded by the N+ type buried layer 203 except for the surface facing to the P type region 205, less amount of carrier (hole) injected is lost and the injection efficiency of the lateral PNP type transistor can be improved.

According to the embodiment of the present invention, since the silicon dioxide layer formed by the selective oxidation process is used as the mask for forming the buried layer 203, the required tapered portion is naturally formed at the edge of window on the mask. For this reason, the silicon dioxide layer is directly used as the mask and thereby the buried layer 203 of which edge extends up to the surface of the silicon substrate 201 can be formed very easily.

What is claimed is:

1. A method for fabricating a bipolar semiconductor integrated circuit device comprising the steps of:
    (a) forming an insulating layer on a semiconductor substrate;
    (b) defining an active region of said semiconductor substrate by the window;
    (c) ion implanting impurities into the semiconductor substrate using the insulating layer as a mask;
    (d) forming buried ion implanted layer in the area not masked by the insulating layer, the buried layer extending up to the surface of the semiconductor substrate at the tapered edges of the insulating layer and extends continuously into the insulating layer from the surface of the semiconductor substrate;
    (e) exposing at least a part of the ion implanted layer at the surface of the semiconductor substrate by removing a portion of the insulating layer; and
    (f) forming a circuit element having the ion implanted layer as the buried layer, in a region of the semiconductor substrate surrounded by the ion implanted layer.

2. A method for fabricating a bipolar semiconductor integrated circuit device according to claim 1, wherein (d), comprises forming said buried ion implanted layer at a depth ranging from 5,000–6,000 Å within the silicon substrate, and at a depth ranging from 4,000–4,5000 Å in said insulating layer.

3. A method for fabricating a bipolar semiconductor integrated circuit according to claim 1, wherein in step (c) comprises performing said ion implanting with an acceleration energy of approximately 400 KeV and a dose of approximately $1 \times 10^{15}$ atoms/cm$^2$.

* * * * *